United States Patent [19]

Lee

[11] Patent Number: 5,757,716
[45] Date of Patent: May 26, 1998

[54] INTEGRATED CIRCUIT MEMORY DEVICES AND METHODS INCLUDING PROGRAMMABLE BLOCK DISABLING AND PROGRAMMABLE BLOCK SELECTION

[75] Inventor: Kyu-Chan Lee, Seoul, Rep. of Korea

[73] Assignee: Samsung Electronics Co., Ltd., Suwon, Rep. of Korea

[21] Appl. No.: 766,370

[22] Filed: Dec. 12, 1996

[30] Foreign Application Priority Data

Dec. 21, 1995 [KR] Rep. of Korea ............... 53540/1995

[51] Int. Cl.$^6$ .............................................. G11C 8/00
[52] U.S. Cl. .......................... 365/230.03; 365/225.7; 365/200
[58] Field of Search ........................ 365/230.03, 225.7, 365/200, 201, 230.08

[56] References Cited

U.S. PATENT DOCUMENTS

| | | | |
|---|---|---|---|
| 5,471,431 | 11/1995 | McClure | 365/225.7 |
| 5,526,317 | 6/1996 | McClure | 365/200 |
| 5,548,225 | 8/1996 | Roundtree et al. | 365/200 |
| 5,576,999 | 11/1996 | Kim et al. | 365/200 |

*Primary Examiner*—Vu A. Le
*Attorney, Agent, or Firm*—Myers Bigel Sibley & Sajovec

[57] ABSTRACT

Programmable disabling and selection circuits operate on a block level for integrated circuit memory devices. Thus, a redundant block can be substituted for a block having more defective rows and/or columns than the number of redundant rows and/or columns which are provided in the integrated circuit memory devices. A plurality of normal block selection circuits are included, a respective one of which produces a respective normal block selection signal in response to an address of a respective one of the plurality of blocks of memory cells. A plurality of programmable block selection circuits are also included, a respective one of which is connected between the respective one of the plurality of normal block selection circuits and a respective one of the plurality of blocks of memory cells. Each programmable block selection circuit includes a first fuse, the activation of which blocks the corresponding one of the plurality of normal block selection circuits. Each of the programmable block selection circuits further includes a plurality of second fuses, the activation of which generates a replacement address for the corresponding one of the plurality of blocks of memory cells. A plurality of block disable circuits are also included, a respective one of which is connected to a respective one of the plurality of blocks of memory cells. Each of the plurality of block disable circuits includes a fuse, the activation of which disables the corresponding one of the plurality of blocks of memory cells.

13 Claims, 5 Drawing Sheets

INTEGRATED CIRCUIT MEMORY DEVICES AND METHODS INCLUDING PROGRAMMABLE BLOCK DISABLING AND PROGRAMMABLE BLOCK SELECTION

FIELD OF THE INVENTION

This invention relates to integrated circuit devices and fabrication methods, and more particularly to integrated circuit memory devices and fabrication methods.

BACKGROUND OF THE INVENTION

Integrated circuit memory devices are generally becoming more highly integrated, with larger numbers of memory cells being formed in a single integrated circuit device. Unfortunately, as more memory cells are integrated into an integrated circuit memory device, it may become difficult to fabricate an integrated circuit memory device having all operational cells.

In order to increase the integrated circuit memory device yields, notwithstanding the presence of defective cells therein, it is known to provide redundancy circuits and methods in integrated circuit memory devices. In particular, row and column redundancy circuits have been provided which replace a row and/or column of memory cells including a defective memory cell therein, with a row and/or column of spare memory cells. The defective memory cells may be identified during a wafer or device test.

Unfortunately, as the number of memory cells in integrated circuit memory devices continues to increase, the number of defective cells may be more than the number of redundant cells which are included in the integrated circuit memory devices. When the number of rows and/or columns of redundant cells exceeds the number of rows and/or columns of defective cells, the integrated circuit memory devices may need to be discarded. Moreover, as the integration density of memory devices continues to increase, it may be increasingly difficult to obtain operational devices without providing an inordinately large number of redundancy rows and/or columns. Accordingly, improved redundancy systems and methods are needed for integrated circuit memory devices.

SUMMARY OF THE INVENTION

It is therefore an object of the present invention to provide improved integrated circuit memory devices and fabrication methods therefor.

It is another object of the present invention to provide improved redundancy circuits and methods for integrated circuit memory devices.

It is yet another object of the present invention to provide integrated circuit memory devices and methods which allow repair of integrated circuit memory devices notwithstanding that there are more defective rows and/or columns than there are redundant rows and/or columns.

These and other objects are provided, according to the present invention, by providing programmable disabling and selection circuits which operate on a block level for integrated circuit memory devices. Thus, a redundant block can be substituted for a block having more defective rows and/or columns than the number of redundant rows and/or columns which are provided in the integrated circuit memory device. Operational integrated circuit memory devices therefore may be provided.

Integrated circuit memory devices according to the present invention include a plurality of blocks of memory cells. Each of the blocks includes an array of memory cells which are arranged in a plurality of memory cell rows and a plurality of memory cell columns. A plurality of normal block selection circuits are included, a respective one of which produces a respective normal block selection signal in response to an address of a respective one of the plurality of blocks of memory cells. A plurality of programmable block selection circuits are also included, a respective one of which is connected between a respective one of the plurality of normal block selection circuits and a respective one of the plurality of blocks of memory cells.

Each programmable block selection circuit includes a first fuse, the activation of which blocks the corresponding one of the plurality of normal block selection circuits. Each of the programmable block selection circuits further includes a plurality of second fuses, the activation of which generates a replacement address for the corresponding one of the plurality of blocks of memory cells. Accordingly, replacement is performed on a "per block" basis; so that operational devices may be provided even though the number of defective rows and/or columns exceeds the number of redundant rows and/or columns.

Integrated circuit memory devices according to the invention also preferably include a plurality of block disable circuits, a respective one of which is connected to a respective one of the plurality of blocks of memory cells. Each of the plurality of block disable circuits includes a fuse, the activation of which disables the corresponding one of the plurality of blocks of memory cells.

For example, each of the plurality of blocks of memory cells includes a corresponding row decoder and word line driver circuit. Each block disable circuit disables the corresponding row decoder and word line driver circuit. In another example, each block of memory cells includes a corresponding equalizing circuit. Each block disable circuit disables the corresponding equalizing circuit. By disabling the defective block of memory cells, power consumption may be reduced.

Integrated circuit memory devices according to the present invention also preferably include a column data output section which is shared between adjacent ones of the plurality of blocks of memory cells. The column data output section senses and amplifies data stored in the memory cell in a block of memory cells which is selected by the plurality of normal block selection circuits and the plurality of programmable block selection circuits.

Block substitution methods according to the present invention operate on integrated circuit memory devices which include a plurality of memory cell blocks. Each of the blocks includes an array of memory cells which are arranged in rows and columns. The plurality of blocks include a corresponding plurality of continuous block addresses from a lowest address to a highest address. Block substitution methods according to the invention include the steps of disabling at least one defective memory cell block and reprogramming the addresses of the memory cell blocks which are higher than the address of the at least one defective memory cell block, such that the reprogrammed addresses provide continuous memory block addresses from the lowest address to the highest address minus the number of defective memory cell blocks.

When each of the memory cell blocks includes a corresponding row decoder and word line driver circuit, the disabling step preferably comprises the step of disabling the row decoder and word line driver circuit corresponding to the defective memory cell blocks. When the memory cell blocks include a corresponding equalizing circuit, the disabling step preferably comprises the step of disabling the equalizing circuit corresponding to the defective memory cell blocks. Reduced power consumption is thereby provided.

The integrated circuit memory devices may comprise a plurality of normal block selection circuits, a respective one of which produces a respective normal block selection signal in response to an address of a respective memory cell block. The reprogramming step then preferably comprises the steps of activating a first fuse associated with each memory cell block having an address which is higher than that of a defective memory block, to thereby block the corresponding normal block selection circuit. A plurality of second fuses associated with each memory cell block having an address which is higher than that of a defective memory block are also activated, to thereby generate reprogrammed addresses which provide continuous memory block addresses from the lowest address to the highest address minus the number of defective memory cell blocks. Accordingly, block substitution may allow integrated circuit memory devices having large numbers of defective rows and/or columns to be usable.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
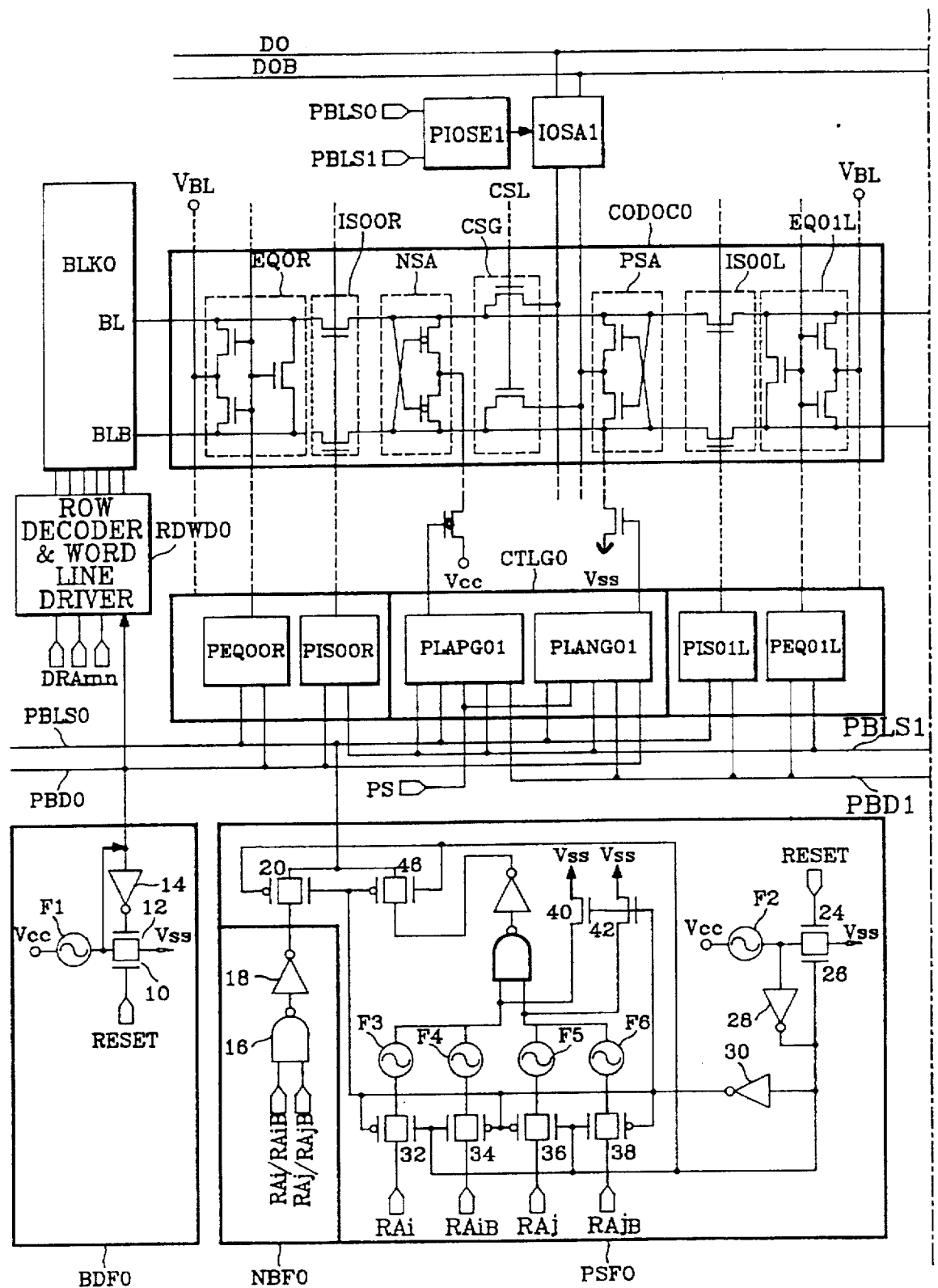
FIGS. 1A–1C together form a schematic diagram of an integrated circuit memory device according to the present invention, including three memory cell blocks.
Figure 1B:
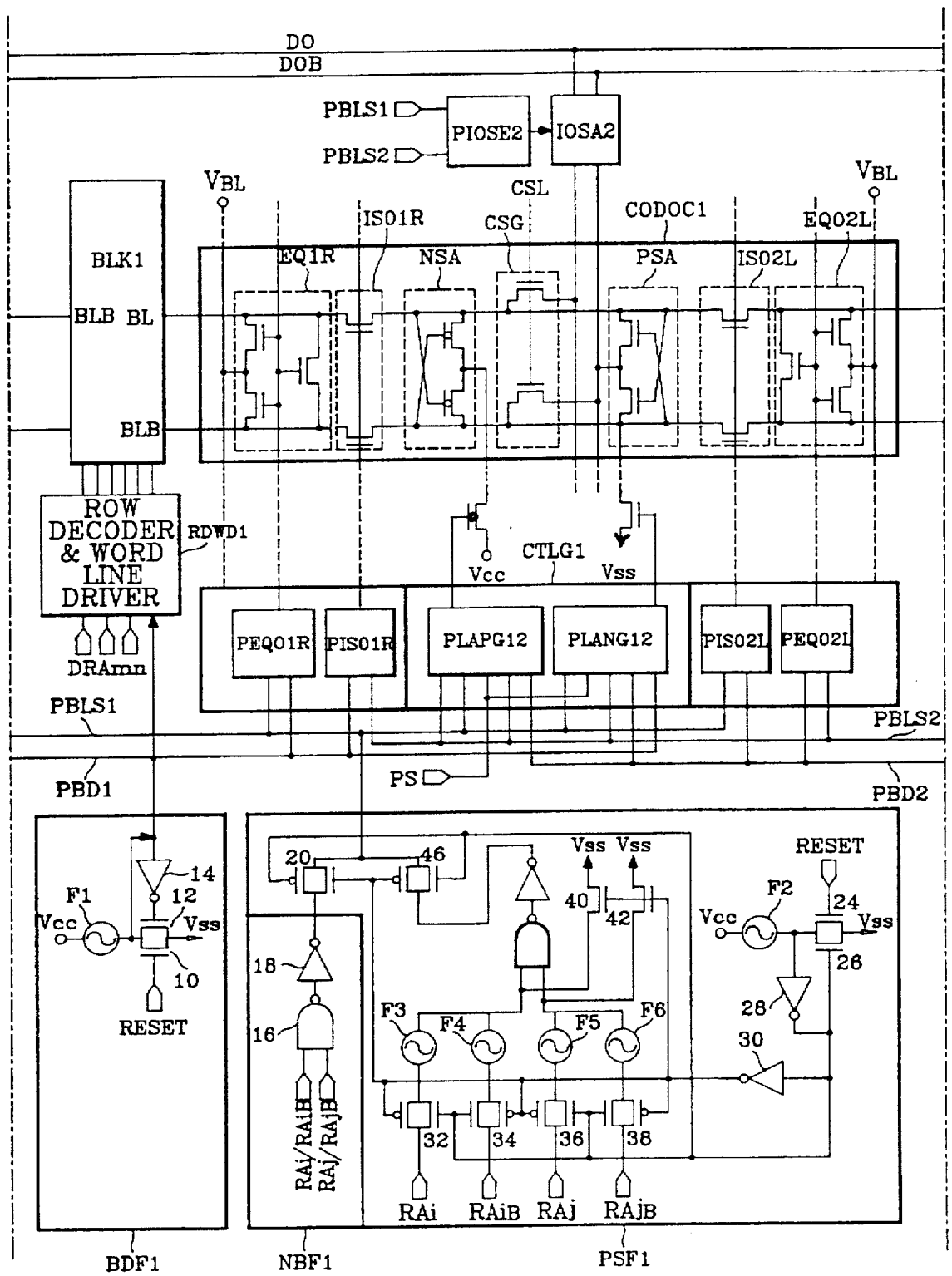
Figure 1C:
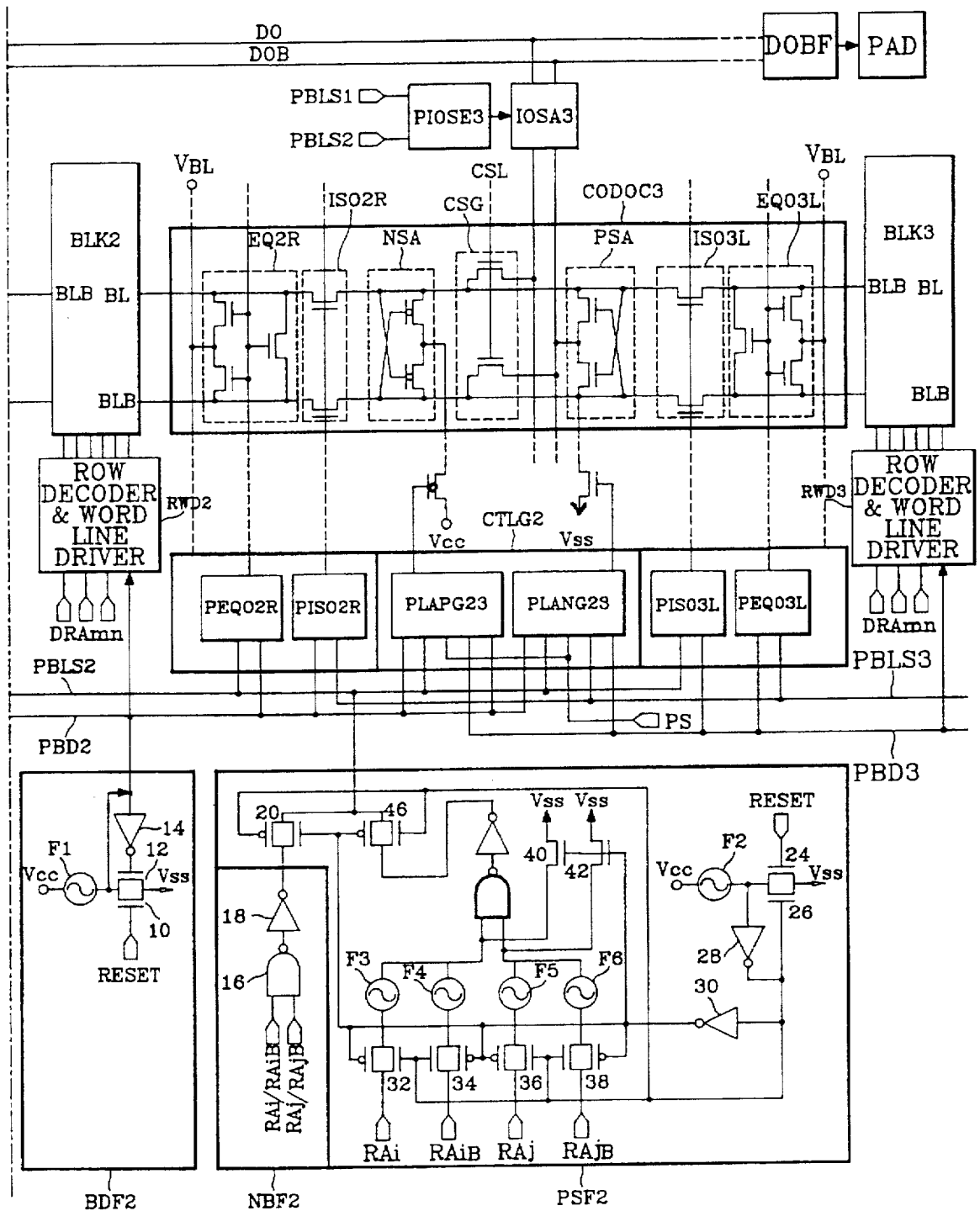

FIGS. 1A, 1B, and 1C together form a schematic diagram of an integrated circuit memory device according to the present invention, which facilitates replacing defective memory cell array blocks. One block is shown in each of FIGS. 1A, 1B and 1C. However, it will be understood that more than three blocks are generally used in an integrated circuit memory device. FIGS. 1A, 1B and 1C, illustrate a memory cell array block for controlling a staggered shared sense amplifier, folded bit line sense amplifier, and a row decoder and word line driver, and peripheral circuits thereof.

Referring now to FIGS. 1A, 1B and 1C, an integrated circuit memory cell includes a plurality of memory cell array blocks BLK0–BLK3, which transfer to bit lines memory cell data corresponding to an activated word line. A plurality of row decoders and word line drivers RDWD0–RDWD3 activate the relevant word line by decoding a predecoded row address DRAmn. RDWD0–RDWD3 are enabled by the respective block driving signals PBD0–PBD3 corresponding to the plurality of memory cell array blocks BLK0–BLK3. A plurality of block disable fuse circuits BDF0–BDF2 disable the block driving signals PBD0–PBD3 by activating (e.g. melting) a fuse F1.

Normal block selection circuits NBF0–NBF2 generate block selection signals PBLS0–PBLS2 for selecting the relevant memory cell array blocks in response to activation of predetermined row address RAi/RAiB, RAj/RAjB. Programmable block selection circuits PSF0–PSF2 activate the block selection signals PBLS0–PBLS2 in response to input of a programmed address. The block selection address of the memory cell array block is programmed by activating (e.g. melting) program fuses F3–F6 and disabling the outputs of the normal block selection circuits NBF0–NBF2 by activating a main fuse F2.

Column data output sections CODOC0–CODOC3 transfer the relevant data signals by sensing and amplifying an output of a memory cell array block, according to an input of block selection signals PBLSi, PBLSj for selecting the adjacent memory cell array blocks BLKi, BLKj. The column data output sections are shared by adjacent memory cell array blocks BLKi (i=1...n) and memory cell array blocks BLKj(j=i+1).

Still referring to FIGS. 1A, 1B and 1c, ISOA1–ISOA3 are input/output sense amplifiers which sense and amplify a signal passed through the channels of the column selection gates within the column data output section CODOC0–CODOC3, so as to output a pair of data lines DO/DOB. DOBF is an output buffer for driving the signal of the data lines DO/DOB to an output pad PAD. PIOSE1–PIOSE3, which are connected to the input/output sense amplifiers ISOA1–ISOA3, are activation controllers for activating the input/output sense amplifiers ISOA0–ISOA3 by means of block selection signals PLSBi and PLSBj. CTLG0–CTLG2 are control signal generators for generating signals that control the precharge of the column data output section CDOC0–CDOC3 and the operation of equalizers, sense amplifiers and separate gates. The control signal generators operate in response to block driving signals PBDi and PBDj, block selection signals PBLSi and PBLSj and a sensing enable signal PS.

Operation of integrated circuit memory devices according to the present invention will now be described with reference to FIGS. 1A–1C. When the defects in all the memory cell array blocks BLK0–BLK3 are repairable by row and column redundancy circuits (not illustrated) or there are no defective cells, the fuses F1 in the block disable circuit BDF0–BDF2, and the main fuses F2 in programmable block selection circuits PBSF0–PBSF2 are not activated (e.g. cut). Block selection operates by the block selection signals PBLS0–PBLS3 according to the decoding operation of normal block selection circuits NBF0–NBF2, and the respective memory cell array blocks BLK0–BLK3 operate in a manner which is similar to conventional integrated circuit memory selection circuits.

If the defects in a memory cell array block, for example, memory cell array block BLK1, are greater than can be repaired by the row and column redundancy circuits, the fuse F1 in the block disable circuit BDF1 of the corresponding memory cell array block BLK1 is activated. The main fuse F2 within the programmable block selection circuits PSF2 and PSF3 and the address programming fuses F3–F6 in the programmable block selection circuits PSF2 and PSF3 that correspond to the memory cell array blocks BLK2 and BLK3 having operational memory cells, are activated. It will be understood that FIGS. 1A–1C only illustrate Blocks BLK0–BLK2, but that block BLK3 is embodied in the same manner, and includes the same circuits and signals as Blocks BLK0–BLK2, but with a suffix 3. Thus, a defective block is eliminated, and an integrated circuit memory device having more defective rows and/or columns than can be repaired using redundant rows and/or columns, can be utilized.

Block address reprogramming according to the invention will now be described. When the fuse in the block disable circuit BDF1, corresponding to the memory cell array block BLK1 which has too many failed cells to be repaired by redundancy circuits, is activated, the outputs of the inverter 14 in the corresponding block disable circuit BDF1 are at "HIGH" level, and the NMOS transistor 12 connected to the output node is turned on. Accordingly, the block driving signal PBD1, corresponding to the memory cell array block BLK1 is output at "LOW" level, and the row decoder and the word line driver RDWD1, which responds to block driving signal PBD1, is disabled. The word line within the memory cell array block BLK1 is also disabled because it cannot be activated.

The disabled block driving signal PBD1, which is disabled to "LOW" as described above, is also applied to the equalizers PEQO1L and PEQO1R and the separate gate and PIOSO1R, respectively. The equalizing circuits EQO1L and EQO1R and the separate gate controllers IOSO1L and IOSO1R respond to the input block driving signal PBD1 that is disabled in "LOW", and supply "LOW" signals to the gates of the NMOS transistors of the equalizers PEQO1L and PEQO1R and to the separate gates PIOSO1L and PIOSO1R which are located at the column data outputs CODOC0 and CODOC1, respectively. This prevents unnecessary current consumption in the defective memory cell array block BLK1. Conventional circuits may be used for the equalizer, the separate gate, the P-sense amplifier, the N-sense amplifier, the column data output CODOC1–CODOC3 and the column selection gate CSG. Therefore, by activating the fuse F1 in the block disable circuit BDF1, the row lines and the column lines of the corresponding memory cell array block BLK1 are disabled.

The main fuses F2 in the programmable block selection circuits PSF2 and PSF3, corresponding to nondefective memory cell array blocks BLK2 and BLK3, are also activated. The outputs of the inverters 28 and 30 corresponding to the programmable block selection circuits PSF2 and PSF3 change to "HIGH" and "LOW", respectively. Thus, the transmission gates 20, which are connected to the respective output nodes of the inverters 28 and 30, are turned off. The transmission gates 32, 34, 36, 38 and 46, rather than the normal block selecting circuits NBF2 and NBF3, are turned on. To assign new addresses for the memory cell array blocks BLK2 and BLK3, the address programming fuses F3, F4, F5 and F6 of the programmable block selection circuits PSF2 and PSF3 are activated according to the addresses to be newly programmed, so as to produce an operational memory device having rearranged block addresses.

Table 1 illustrates the above methods in more detail. Table 1 assumes that the memory cell array block BLK1 includes too many failed cells, and must be disabled. The designation "cut" indicates a fuse which is activated, and the designation "uncut" indicates a fuse which is not activated.

TABLE 1

| MEMORY CELL ARRAY BLOCK | BLK0 | BLK1 | BLK2 | BLK3 |
|---|---|---|---|---|
| FUSE F1 | UNCUT | CUT | UNCUT | UNCUT |
| FUSES F2, F3–F6 | DON'T CARE | UNCUT | CUT | CUT |
| NEW BLOCK SELECTION SIGNAL | BLK0 | X | BLK1 | BLK2 |

Thus, if the memory cell array blocks BLK0–BLK3 are 4 megabit ×16 blocks to form a 64 megabit memory, the unit memory cell array block BLK1 is disabled and the address of the other three unit memory cell array blocks BLK0, BLK2 and BLK3 are rearranged to construct a 3 megabit ×16 memory device.

The present invention may improve yields by reprogramming the addresses of memory blocks. A functional memory device is produced even though the failed blocks cannot be repaired by the available row/column redundancy circuits. If an extra memory cell array block is provided in the integrated circuit memory device, the failed memory cell array block can be repaired and the whole memory cell array can be functional.

Figure 2:
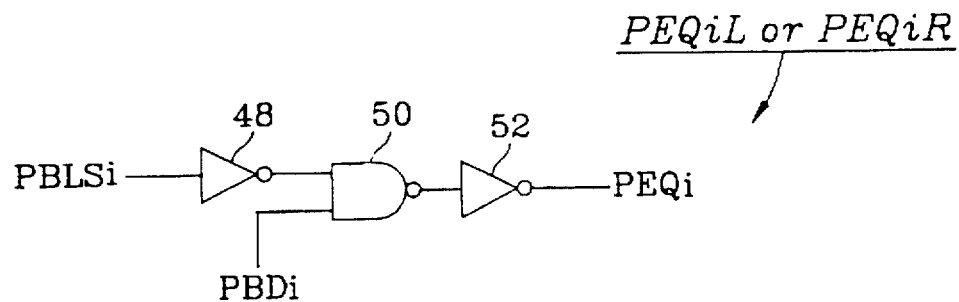
FIG. 2 illustrates an embodiment of equalizing control circuits PEQi of FIGS. 1A–1C.

FIG. 2 illustrates an embodiment of the equalizing circuits PEQi of FIG. 1A, FIG. 1B and FIG. 1C. The equalizing circuits comprise a first inverter 48 for inverting a block selection signal PBLSi, a NAND gate 50 for NANDing the output of the inverter 48 and a block driving signal PBDi, and a second inverter 52 for inverting the NAND operated results. This construction is designed to selectively control the equalizer PEQi of the memory cell array block BLKi, corresponding to the block selection signal PBLSi, in a state that the block driving signal PBDi is always enabled to logic "HIGH".

Figure 3:
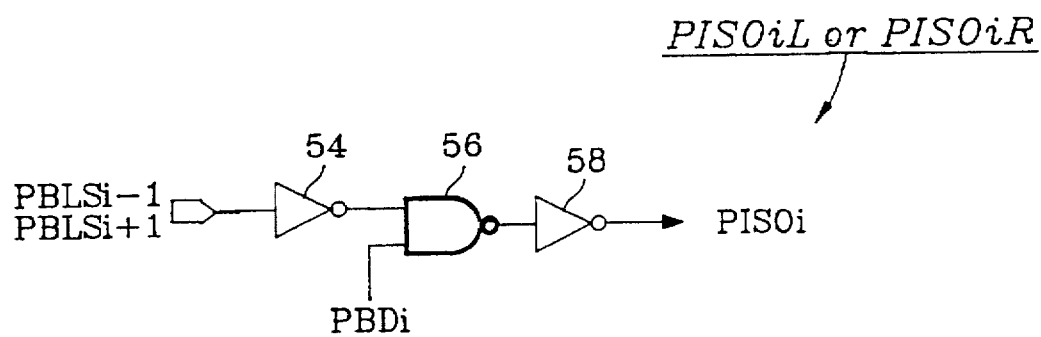
FIG. 3 illustrates an embodiment of separate gate control circuits PISOi of FIGS. 1A–1C.

FIG. 3 illustrates an embodiment of the separate gate control circuits PISOi of FIGS. 1A, 1B and 1C according to the present invention. This construction is the same as FIG. 2. The circuit of FIG. 3 is designed to drive the corresponding separate gate when only one out of the right and left memory cell array block selection signals PBLSi−1 and PBLSi+1 is enabled, in a state that the corresponding block driving signal PBDi is enabled.

Figure 4:
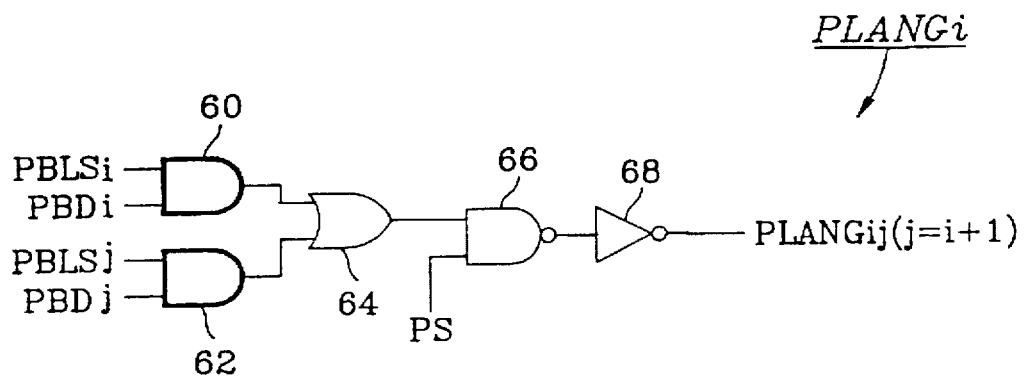
FIG. 4 illustrates an embodiment of N sense amplifying control circuits PLANGi of FIGS. 1A–1C.

FIG. 4 illustrates an embodiment of the N-sense amplifying control circuits PLANGi of FIG. 1A, FIG. 1B and FIG. 1C according to the present invention. This circuit is designed to enable the corresponding N-sense amplifier driving signal PLANGij when only one of the right and left memory cell array block selection signals PBLSi and PBLSj is enabled and the sensing enable signal PS is activated, in a state that the block driving signal PBDi or PBDj of the adjacent memory cell array block BLKij is enabled.

Figure 5:
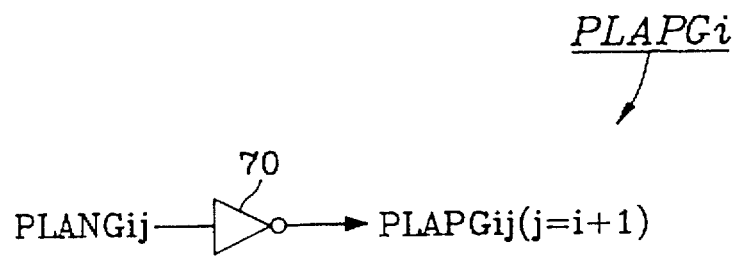
FIG. 5 illustrates an embodiment of P sense amplifying control circuits PLAPGi of FIGS. 1A–1C.

FIG. 5 illustrates an embodiment of the P-sense amplifying control circuits PLAPGi of FIG. 1A, FIG. 1B and FIG. 1C according to the present invention. As shown, the N-sense amplifier driving signal PLANGij generated in FIG. 4 is inverted so as to generate the P-sense amplifier driving signal PLAPGij.

When two adjacent memory cell array blocks, for example BLK1 and BLK2, are defective memory cell array blocks, the P-sense amplifier driving signal PLAPG12 becomes "HIGH" and the N-sense amplifier becomes "LOW", so that the sense amplifiers are disabled. Additionally, the activation control signal PIOSE of the input/output sense amplifier also becomes "LOW" and the output of the corresponding input/output sense amplifier is opened, so that a pair of data lines DO/DOB are disabled.

Figure 6:
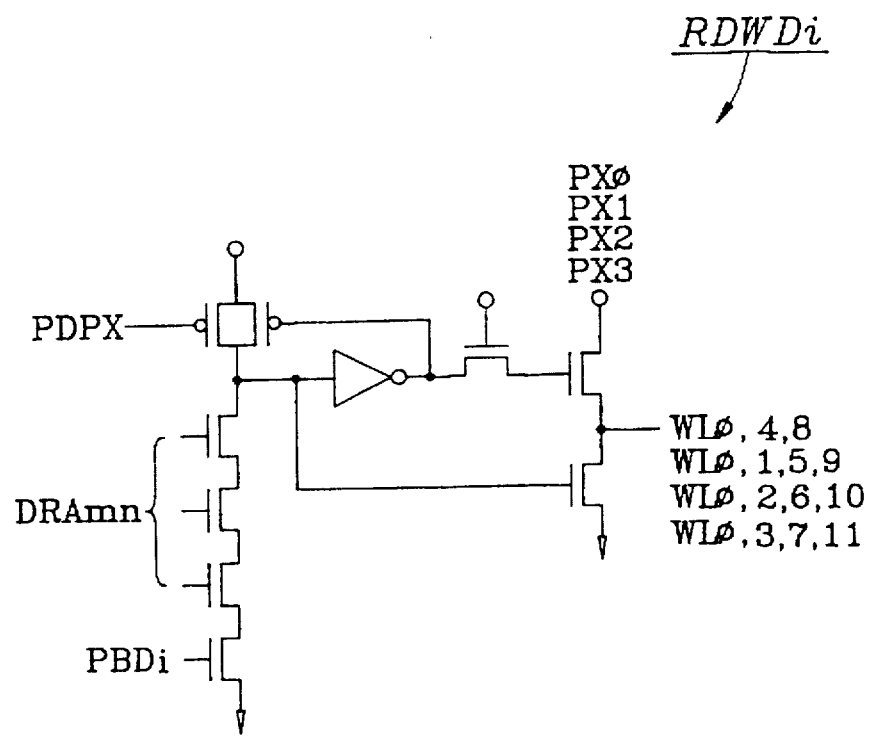
FIG. 6 illustrates an embodiment of row decoders and word line drivers RDWDi of FIGS. 1A–1C.

FIG. 6 illustrates an embodiment of the row decoder and the word line drivers RDWDi of FIG. 1A, FIG. 1B and FIG. 1C. The row decoder and word line drivers use conventional construction. The row decoder and the word line drivers are enabled only when the corresponding block driving signal PBDi is activated to a "HIGH" state so as to decode the decoded row address DRAmn. As described above, the present invention can increase yields by reprogramming the address of a block and reconstructing the memory cell array block when a failed block cannot be repaired by row/column redundancy circuit.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:

a plurality of blocks of memory cells, each of said blocks comprising an array of memory cells which are arranged in a plurality of memory cell rows and a plurality of memory cell columns;

a plurality of normal block selection circuits, a respective one of which produces a respective normal block selection signal in response to an address of a respective one of said plurality of blocks of memory cells; and a plurality of programmable block selection circuits, a respective one of which is connected between a respective one of said plurality of normal block selection circuits and a respective one of said plurality of blocks of memory cells, each of said programmable block selection circuits including a first fuse, the activation of which blocks the corresponding one of said plurality of normal block selection circuits, each of said programmable block selection circuits further including a plurality of second fuses, the activation of which generates a replacement address for the corresponding one of said plurality of blocks of memory cells.

2. An integrated circuit memory device according to claim 1 further comprising:

a plurality of block disable circuits, a respective one of which is connected to a respective one of said plurality of blocks of memory cells, each of said plurality of block disable circuits including a fuse, the activation of which disables the corresponding one of said plurality of blocks of memory cells.

3. An integrated circuit memory device according to claim 2 wherein each of said plurality of blocks of memory cells includes a corresponding row decoder and word line driver circuit, and wherein each of said plurality of block disable circuits disables the corresponding row decoder and word line driver circuit.

4. An integrated circuit memory device according to claim 2 wherein each of said plurality of blocks of memory cells includes a corresponding equalizing circuit, and wherein each of said plurality of block disable circuits disables the corresponding equalizing circuit.

5. An integrated circuit memory device according to claim 3 further comprising a column data output section between adjacent ones of said plurality of blocks of memory cells, which senses and amplifies data stored in a memory cell in a block of memory cells, and which is selected by said plurality of normal block selection circuits and said plurality of programmable block selection circuits.

6. An integrated circuit memory device comprising:

a plurality of blocks of memory cells, each of said blocks comprising an array of memory cells which are arranged in a plurality of memory cell rows and a plurality of memory cell columns;

a plurality of normal block selection circuits, a respective one of which produces a respective normal block selection signal in response to an address of a respective one of said plurality of blocks of memory cells;

a plurality of programmable block selection circuits, a respective one of which is connected between a respective one of said plurality of normal block selection circuits and a respective one of said plurality of blocks of memory cells, each of said programmable block selection circuits including a first fuse, the activation of which blocks the corresponding one of said plurality of normal block selection circuits, each of said programmable block selection circuits further including a plurality of second fuses, the activation of which generates a replacement address for the corresponding one of said plurality of blocks of memory cells;

a plurality of block disable circuits, a respective one of which is connected to a respective one of said plurality of blocks of memory cells, each of said plurality of block disable circuits including a fuse, the activation of which disables the corresponding one of said plurality of blocks of memory cells; and a column data output section between adjacent ones of said plurality of blocks of memory cells, which senses and amplifies data stored in a memory cell in a block of memory cells, and which is selected by said plurality of normal block selection circuits and said plurality of programmable block selection circuits.

7. An integrated circuit memory device according to claim 6 wherein each of said plurality of blocks of memory cells includes a corresponding row decoder and word line driver circuit, and wherein each of said plurality of block disable circuits disables the corresponding row decoder and word line driver circuit.

8. An integrated circuit memory device according to claim 6 wherein each of said plurality of blocks of memory cells includes a corresponding equalizing circuit, and wherein each of said plurality of block disable circuits disables the corresponding equalizing circuit.

9. A block substitution method for an integrated circuit memory device including a plurality of memory cell blocks, each of which comprises an array of memory cells which are arranged in rows and columns, said plurality of blocks including a corresponding plurality of continuous block addresses from a lowest address to a highest address, said block substitution method comprising the steps of:

disabling at least one defective memory cell block; and reprogramming the addresses of said memory cell blocks which are higher than the address of the at least one defective memory cell block, such that the reprogrammed addresses provide continuous memory block addresses from said lowest address to said highest address minus the number of defective memory cell blocks.

10. A method according to claim 9 wherein said integrated circuit memory device further comprises a plurality of normal block selection circuits, a respective one of which produces a respective normal block selection signal in response to an address of a respective memory cell block, and wherein said reprogramming step comprises the steps of:

activating a first fuse associated with each memory cell block having an address which is higher than that of a defective memory cell block, to thereby block the corresponding normal block selection circuit; and activating a plurality of second fuses associated with each memory cell block having an address which is higher than that of a defective memory block, to thereby generate reprogrammed addresses which provide continuous memory block addresses from said lowest address to said highest address minus the number of defective memory cell blocks.

11. A method according to claim 9 wherein each of said memory cell blocks includes a corresponding row decoder and word line driver circuit, and wherein said disabling step comprises the step of disabling the row decoder and word line driver circuit corresponding to the at least one defective memory cell block.

12. A method according to claim 9 wherein each of said memory cell blocks includes a corresponding equalizing circuit, and wherein said disabling step comprises the step of disabling the equalizing circuit corresponding to the at least one defective memory cell block.

13. A method according to claim 9 wherein said disabling step is preceded by the step of:

determining that there are more defective memory cells in said at least one defective memory cell block than can be repaired using redundant rows and/or columns of memory cells.

* * * * *